(12) United States Patent
Wong

(10) Patent No.: US 9,285,445 B2
(45) Date of Patent: Mar. 15, 2016

(54) MAGNETIC RESONANCE IMAGING USING RANDOMIZED RADIO FREQUENCY PULSES

(75) Inventor: Eric C. Wong, Del Mar, CA (US)

(73) Assignee: The Regents of the University of California, Oakland, CA (US)

(*) Notice: Subject to any disclaimer, the term of this patent is extended or adjusted under 35 U.S.C. 154(b) by 915 days.

(21) Appl. No.: 13/444,806

(22) Filed: Apr. 11, 2012

(65) Prior Publication Data

US 2012/0256628 A1 Oct. 11, 2012

Related U.S. Application Data

(60) Provisional application No. 61/474,161, filed on Apr. 11, 2011.

(51) Int. Cl.
*G01R 33/50* (2006.01)
*G01R 33/483* (2006.01)

(52) U.S. Cl.
CPC ............ *G01R 33/4836* (2013.01); *G01R 33/50* (2013.01)

(58) Field of Classification Search
USPC .......................... 324/300–322; 600/407–435; 382/128–131
See application file for complete search history.

(56) References Cited

U.S. PATENT DOCUMENTS

| | | | |
|---|---|---|---|
| 4,985,677 A * | 1/1991 | Pauly | 324/309 |
| 6,476,607 B1 * | 11/2002 | Dannels et al. | 324/309 |
| 6,487,435 B2 * | 11/2002 | Mistretta et al. | 324/307 |
| 6,549,008 B1 * | 4/2003 | Anand et al. | 324/307 |
| 6,828,788 B2 * | 12/2004 | Wang | 324/309 |
| 7,659,718 B1 * | 2/2010 | Lustig et al. | 324/309 |
| 7,777,488 B2 * | 8/2010 | Gore et al. | 324/309 |
| 8,664,954 B2 * | 3/2014 | Hetzer et al. | 324/309 |
| 2001/0027262 A1 * | 10/2001 | Mistretta et al. | 600/9 |
| 2003/0164701 A1 * | 9/2003 | Wang | 324/307 |
| 2009/0021254 A1 * | 1/2009 | Gore et al. | 324/309 |
| 2010/0026294 A1 * | 2/2010 | Lustig et al. | 324/307 |
| 2010/0322497 A1 * | 12/2010 | Dempsey et al. | 382/131 |
| 2012/0013336 A1 * | 1/2012 | Hetzer et al. | 324/309 |
| 2012/0256628 A1 * | 10/2012 | Wong | 324/309 |
| 2014/0200435 A1 * | 7/2014 | Edelman et al. | 600/410 |

FOREIGN PATENT DOCUMENTS

WO WO 2010112039 A1 * 10/2010

OTHER PUBLICATIONS

Haldar, Justin P. et al., Compressed-Sensing MRI with Random Encoding, IEEE Transactions on Medical Imaging, vol. 30, Issue 4, Oct. 11, 2010, 14 pages.

* cited by examiner

*Primary Examiner* — Melissa Koval
*Assistant Examiner* — Tiffany Fetzner
(74) *Attorney, Agent, or Firm* — Perkins Coie LLP

(57) ABSTRACT

Methods, systems and apparatus for magnetic resonance imaging that facilitate applying a gradient waveform to generate a k-space trajectory in a subject, applying radio frequency (RF) pulses having a pseudorandom phase distribution, such that the RF pulses are applied to the subject at a plurality of non-uniform locations near a center of the k-space trajectory and collecting, based on the applied RF pulses and the applied gradient waveform, imaging data from the subject.

20 Claims, 16 Drawing Sheets

$M_{XY}$ along gradient trajectory 1304

$M_{XY}$ at each crossing of K=0 1302

Extension to 3D

MAGNETIC RESONANCE IMAGING USING RANDOMIZED RADIO FREQUENCY PULSES

CROSS REFERENCES TO RELATED APPLICATIONS

This patent document claims the benefit of priority of U.S. Provisional Patent Application No. 61/474,161, filed on Apr. 11, 2011. The entire content of the above referenced provisional patent application is incorporated by reference as a part of this patent document.

BACKGROUND

This application relates to devices and techniques that use magnetic resonance imaging (MRI) techniques.

Imaging through MRI techniques is well known and has been widely applied in imaging applications in medical, biological and other fields. In essence, a typical MRI technique produces an image of a selected body part of a subject under examination by manipulating the magnetic spins in a body part and processing measured responses from the magnetic spins. Existing MRI methods are built around the 40 year old concept that MRI data should be the Fourier Transform of the desired image. Recently, Compressed Sensing (CS) technology has been introduced that provides an approach for reconstructing images and other data from incomplete data. When applied to MRI, CS has been used to reconstruct images from incomplete Fourier samples.

Improved MRI techniques are needed.

SUMMARY

Techniques and structures and apparatus are disclosed for implementing efficient excitation of magnetization for compressed sensing MRI.

The subject matter described in this specification potentially can provide one or more of the following advantages. The described techniques for efficient excitation of magnetization for compressed sensing MRI can potentially provide high signal-to-noise ration (SNR) efficiency. For example, the described techniques can be used to generate signal magnitude similar to the conventional balanced steady-state free precession (SSFP) imaging (see FIG. 5), but with higher duty cycle (99% data acquisition time for the described method vs. 20-50% for balanced SSFP). Also, the described techniques for efficient excitation of magnetization for compressed sensing MRI can potentially provide low RF power deposition (low SAR-specific absorption rate). Relative to balanced SSFP, the described 2° radio frequency (RF) pulses deposit approximately 15 times less RF power than the 30° pulses of balanced SSFP. Therefore, in one advantageous aspect, the described method can be used in a medical diagnostic setting by reducing the exposure of a subject to magnetization. Moreover, the described techniques for efficient excitation of magnetization for compressed sensing MRI can potentially enable efficient use of gradients. In balanced SSFP, at least 50% of the time, gradients are being used to provide excitation, and then movement around k-space before data acquisition. In the described method, the gradients continuously move in a recirculating path that is amenable to nearly continuous (99%) data acquisition.

In one exemplary aspect, a magnetic resonance imaging method is disclosed. A gradient waveform is applied to generate a k-space trajectory in a subject. Radio frequency (RF) pulses having a pseudorandom phase distribution are applied, such that the RF pulses are applied to the subject at a plurality of non-uniform locations near a center of the k-space trajectory. Based on the applied RF pulses and the applied gradient waveform, imaging data is collected from the subject.

In another exemplary aspect, a magnetic resonance imaging apparatus is disclosed. The apparatus includes a module for applying a gradient waveform to generate a k-space trajectory in a subject, a module for applying radio frequency (RF) pulses having a pseudorandom phase distribution, such that the RF pulses are applied to the subject at a plurality of non-uniform locations near a center of the k-space trajectory and a module for collecting, based on the applied RF pulses and the applied gradient waveform, imaging data from the subject. In some implementations, the module 1706 may be implemented as one or more collector coils.

These and other aspects are further described below.

BRIEF DESCRIPTION OF THE DRAWINGS

Like reference symbols and designations in the various drawings indicate like elements.

DETAILED DESCRIPTION

Figure 1:
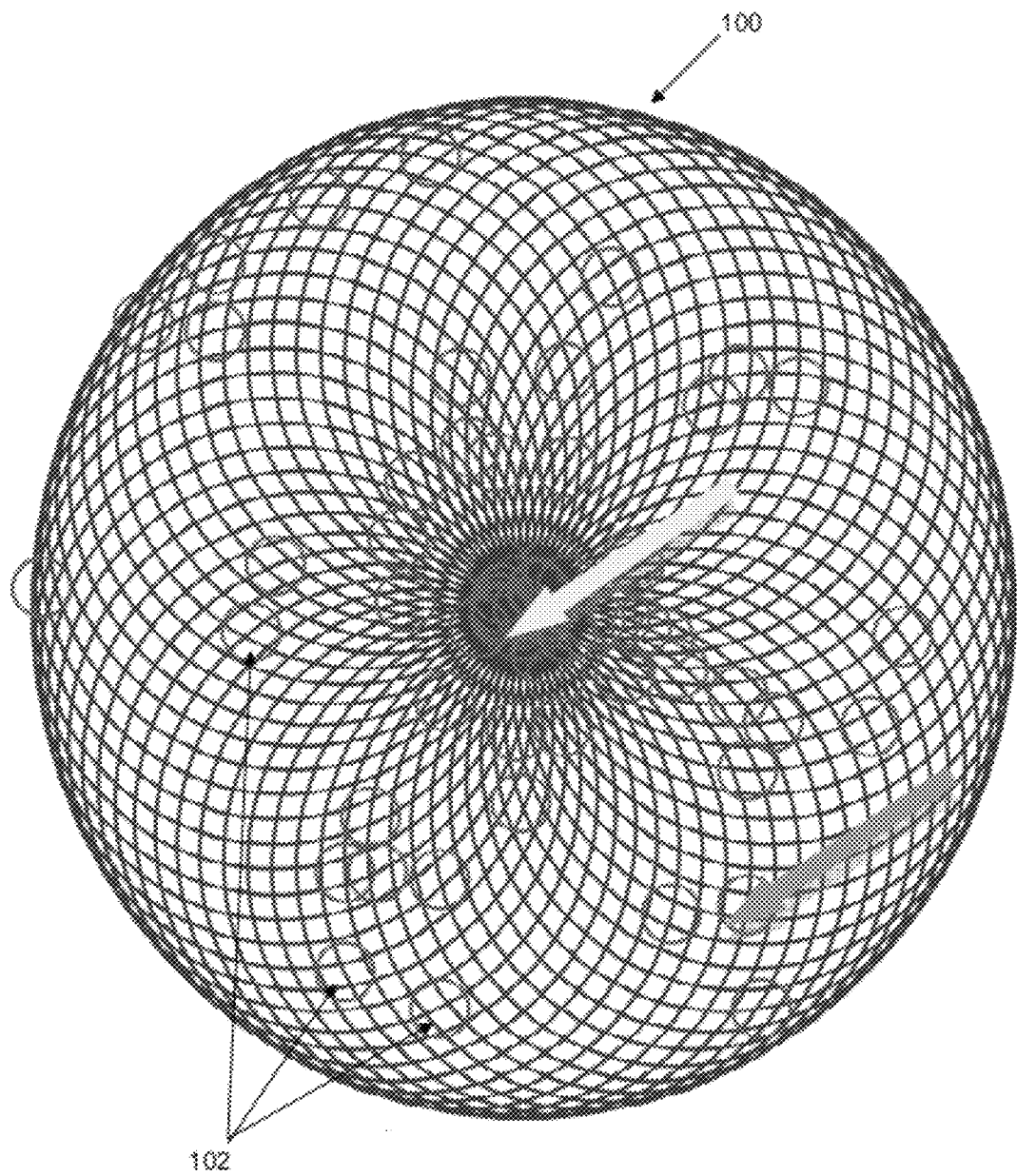
FIG. 1 shows an example gradient trajectory and RF pulses.

Magnetic Resonance Imaging (MRI) has gained importance in recent years as a non-invasive technique to be able to view structures such as organs and muscles internal to a subject. However, conventional MRI systems still suffer from certain operational limitations.

In a typical MRI application, a magnetic field is applied to a subject, causing magnetization of some atomic nuclei of the subject. Radio Frequency (RF) pulses are repeatedly applied to systematically alter the alignment of the induced magnetization, causing the subject nuclei to produce a rotating magnetic field that can be observed using MRI coils. The observed data is processed to produce MRI images of the subject.

One operational limitation that characterizes several conventional MRI systems is that the duty cycle (i.e., the percent of time useful in obtaining magnetization reads of the subject) tends to be fairly low, typically in the 30 to 50% range. An MRI system having a lower duty cycle may need to expose a patient longer to magnetic fields to obtain images having quality comparable to an MRI system having a higher duty cycle. An MRI technique that has a high duty cycle is therefore desirable.

Another limitation of certain conventional MRI techniques is that the flip angle, i.e., the angle by which net magnetization is rotated or tipped relative to the main magnetic field, tends to be high, e.g., around about 30 degrees. One undesirable side-effect of a high flip angle may be that higher RF energy may need to be applied to the subject to obtain good quality images, causing tissue heating. Therefore, an MRI technique that has a low flip angle is desirable.

Yet another limitation of certain conventional MRI techniques is that the data generated by reading the induced magnetization may not be well disposed to take advantage of certain powerful image reconstruction algorithms. For example, recent advances in the compressed sensing theory, which is useful in reconstructing image data from a limited samples, is known to better when the image samples that are used for compressed sensing reconstruction represent projections on random functions. Therefore, an MRI technique that produces such an image data is desirable.

In some clinical uses, MRIs with different image contrast for the same subject anatomy are desirable for diagnostic purpose. It is therefore desirable that an MRI technique can produce such images without having to expose the subject to longer magnetization/RF radiations to obtain multiple-contrast images.

The techniques, structures and apparatus disclosed in this document are useful in satisfying one or more of the above-discussed MRI features.

The techniques, structures and apparatus described in this application can be used to implement a fast and efficient way to excite nuclear spins in the MR imaging process. A new class of pulse sequences can be implemented to generate pseudorandom patterns of excitation. In one aspect, a rapid train of random phase low flip angle RF pulses can generate large steady state transverse (detectable) magnetization. Additionally, gradients applied between these RF pulses that have a pseudorandom distribution weighted towards the center of k-space can generate a distribution of coherences that result in a pseudorandom spatial pattern of excitation.

Compressed sensing (CS) technology (1) can be useful to focus on the information content in MR imaging data, rather than specifically fulfilling the Nyquist sampling criterion. The desired properties of efficient MR data acquisition are disclosed, beginning with the following observations: 1) CS reconstruction calls for sampling functions that are incoherent (dense) in the sparse domain; 2) SNR efficiency is maximized with high steady state transverse magnetization and high A/D duty cycle, as exemplified by balanced SSFP; 3) In clinical MRI, images of the same anatomy with different image contrast are often acquired, and the mutual information between these images is high. In response to these criteria, the following imaging strategy can be implemented.

MRI Methods

1) Short TR imaging with random phase RF. Random phase RF pulses can produce similar steady state transverse magnetization to balanced SSFP, but the magnitude of the response is independent of resonance offset, and the peak response for physiological $T_1$ and $T_2$ values occurs at much lower flip angle. At $T_1$=1000 ms, $T_2$=50 ms, and TR=1 ms, 2° random phase or 40° phase alternating pulses both produce a steady state RMS $M_{xy}$ of approximately 0.1 $M_0$.

2) A low peak curvature gradient trajectory for rapid sampling of spatial information that re-circulates in a conventional sized patch of k-space with RF pulses applied at random locations near the center of the trajectory. After many pulses this generates a distribution of coherences, which produces spatially random excitation with feature sizes that are controllable by the distribution of pulses, and has dense representations in most transform domains. Excitation in any particular voxel is modulated randomly in time, which encodes $T_1$ and $T_2$ data into the signal. The rosette trajectory (2) with nearly circular petals is an example of a trajectory with low curvature and allows for rapid continuous k-space traversal.

3) Simultaneous estimation of proton density, relaxation times, and resonance offset using CS methods.

Data was simulated using direct integration of the Bloch equations and the following parameters: real human source images of proton density $T_1$, and $T_2$ at 64×64 resolution; synthesized quadratic field map with peak offset of 3 Hz; 64 petals with 64 points collected on each petal; 10 ms per data point for a total scan time of 41 ms; one 4° rf pulse per petal, with a Gaussian distribution with s=0.25*kmax.

Reconstruction was by iterative minimization using conjugate gradient descent and numerical calculation of gradients. The cost function was:

$$C(pd, T_2, f) = \|F(pd, T_2, f) - y\|_2^2 + \lambda_1 \|W(pd)\|_1 + \lambda_2 TV(pd) \quad \text{Equation (1)}$$

where pd is the proton density, f is the field map, y is the simulated data, F( ) generates simulated data, W( ) is a wavelet transform, and $1_n$ are adjusted so that the contributions to C are on the same order. In addition, the gradient of the field map was smoothed with a Gaussian kernel with s=9 pixels at each iteration, and 200 iterations were used.

Results

An example rosette trajectory is shown in FIG. 1 with random phase 2° RF pulses applied at the circle locations 102. FIG. 1 shows the gradient trajectory (mesh-like curve 100) and RF pulses (circular locations 102).

Figure 2:
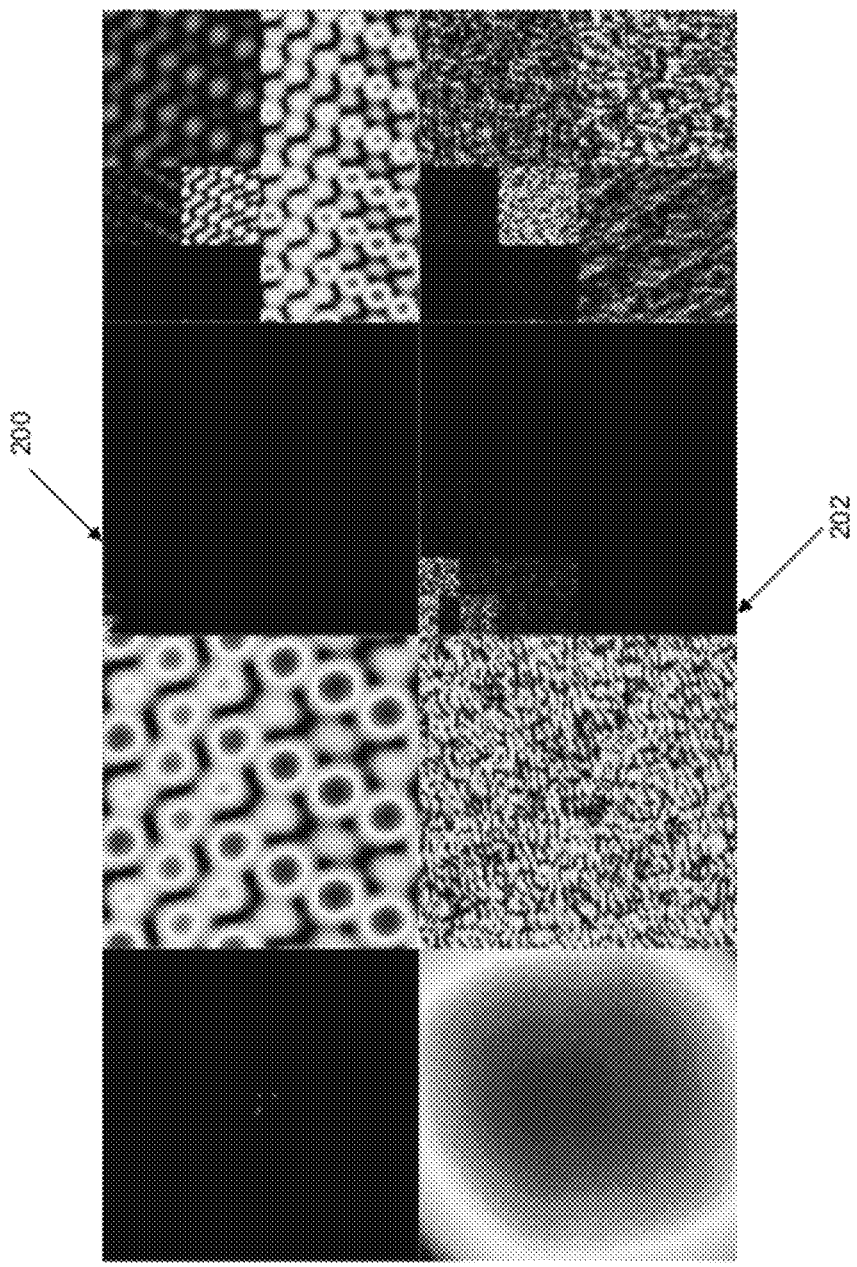
FIG. 2 shows a response to a pulse sequence of FIG. 1 after 4 and 64 RF pulses.

For the pulse sequence depicted in FIG. 1, the state of the spin system after the $4^{th}$ and $64^{th}$ RF pulses is shown in FIG. 2. FIG. 2 shows a response to pulse sequence of FIG. 1 after 4 (top, row 200) and 64 (bottom, row 202) RF pulses. From left: Relative density of transverse coherences in k-space; Mxy in image space; Wavelet transform of Mxy at points indicated by yellow and green arrows in FIG. 1. After 4 pulses the FIDs of the pulses dominate the coherences, as echo pathways are slow to build up when the flip angles are small. After 64 pulses a nearly continuous distribution of coherences exists, but with random phases. The magnetization is noise like in image space, and the wavelet representation of the sampling function is relatively dense compared to that of Fourier basis functions.

Figure 3:
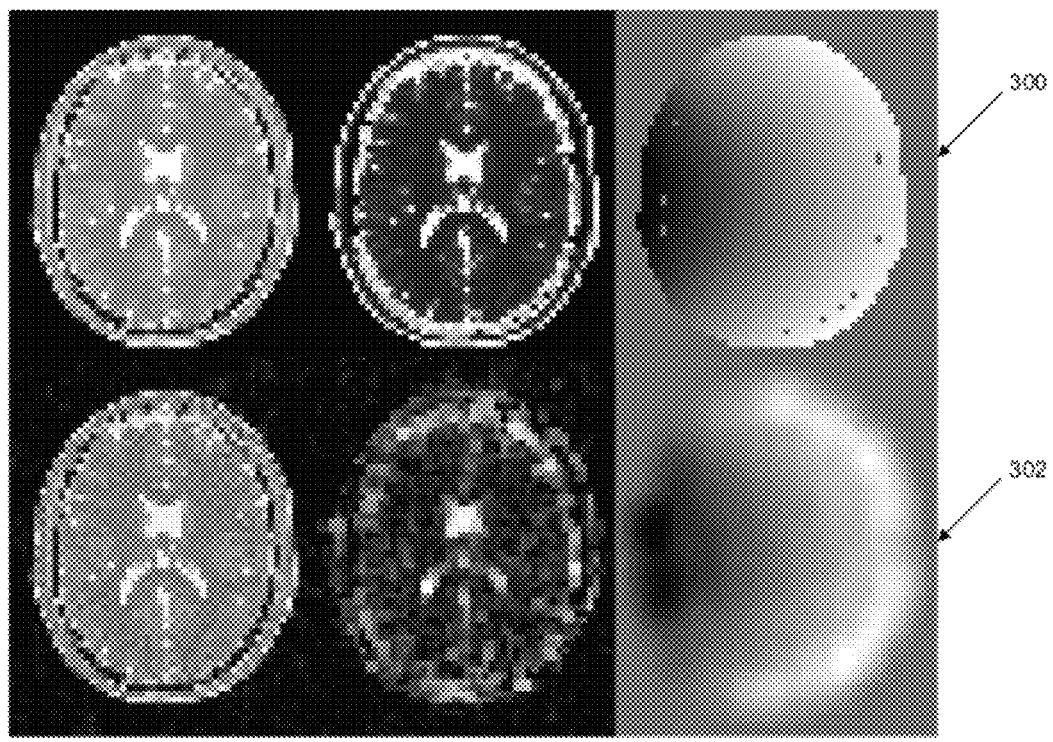
FIG. 3 is an arrangement of source images (top row) and images reconstructed from simulated data (bottom row) showing from left: proton density, T2 and field map.

FIG. 3 shows the original and reconstructed proton density, $T_2$, and field maps. In FIG. 3, the top row 300 shows source images and the bottom row 302 shows the corresponding images reconstructed from simulated data. From left are shown proton density, T2, and field map. These 3 maps are estimated using $64^2$ data points, equal to the number of pixels in one map.

In FIG. 3, images should be indistinguishable from current high resolution clinical images, and simultaneously provide multiple contrasts (proton density, T1, T2, and resonance frequency). It will be appreciated by one of skill in the art that the resolution as shown in FIG. 3 is limited because the reconstruction method is prone to falling into local minima, and will not generally find the optimal solution. Better reconstructions can be achieved using faster computation and more efficient reconstruction algorithms.

Discussion

The approach disclosed here simultaneously produces high steady state signal, high A/D duty cycle, and pseudo-random sampling functions, and is therefore both SNR efficient and amenable to CS reconstruction. Because the mutual information between proton density, $T_1$, and $T_2$ is high, simultaneous estimation of proton density, $T_1$, and $T_2$ is more efficient than separate acquisition of the same anatomy with different contrasts, and it is natural to add mutual information to the cost function. The distribution of coherences is controlled by the distribution of RF pulses and by the flip angle, which determines the weighting of echo pathways, and there is a tradeoff in which the randomness of the sampling function improves with a broader coherence distribution, but eventually leads to signal loss due to intravoxel dephasing. Extension to 3D is straightforward, and the sparsity in the wavelet domain will increase with dimension and resolution. Using this approach, $256^3$ data points can be collected in approximately 1 min with current gradient hardware, and the rapid acquisition of high resolution volumetric anatomical and parameter maps is possible.

For compressed sensing reconstruction, a desired property is that the sampling function is incoherent in the sparse domain. For example, in some implementations, the sampling function may such that in the sparse affine domain, the incoherency from the basis function may be spread across many samples (coefficients) of the basis function.

In one implementation, a series of 128 RF pulses is used to generate a sampling function that is spatially pseudorandom, and is incoherent under nearly any sparsifying transform. For a typical sparsifying transform, such as the wavelet transform, a desirable sampling function that includes about 46% of the wavelet coefficients to capture 90% of the energy of the sampling function may be sufficient to implement the disclosed techniques. By contrast, a Fourier sampling function only requires 1% of the wavelet coefficients to capture 90% of the energy of the sampling function (i.e., highly coherent function). The incoherence in the sampling function sufficient to implement the techniques disclosed in this document would therefore be appreciated by one of skill in the art.

Figure 4:
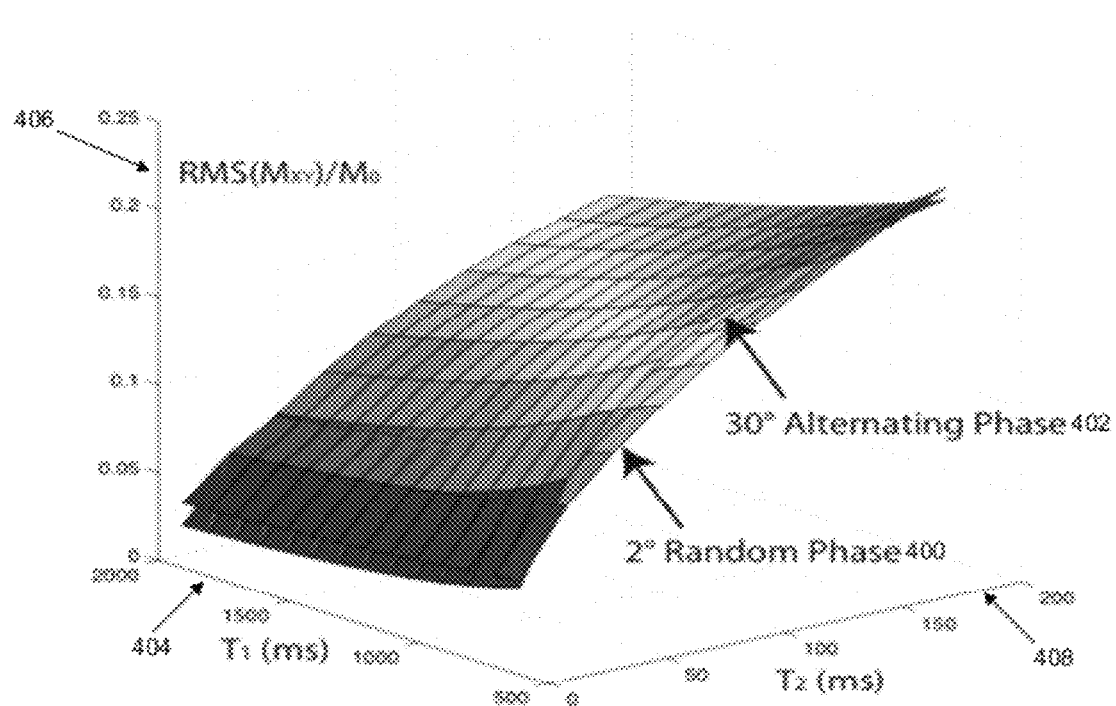
FIG. 4 shows simulated steady state magnetization using very small flip angle (2°) random phase pulse train versus a more conventional 30° alternating phase method known as balanced SSFP.

FIG. 4 shows the simulated steady state magnetization using very small flip angle) (2° random phase pulse train (400), vs the more conventional 30° alternating phase method known as balanced SSFP (402). The results are plotted in a coordinate system including axis 404 representing T1 in milliseconds, axis 408 representing T2 in milliseconds and axis 406 representing root-mean-squared RF power density. The magnetization is nearly identical in magnitude, but unlike balanced SSFP (402), the frequency response 400 is inherently flat because of the random phase, and the RF power deposition is dramatically lower. Because the RF power is proportional to the RF amplitude squared, the relative power can be as low as $(2/30)^2=0.0044$.

Figure 5:
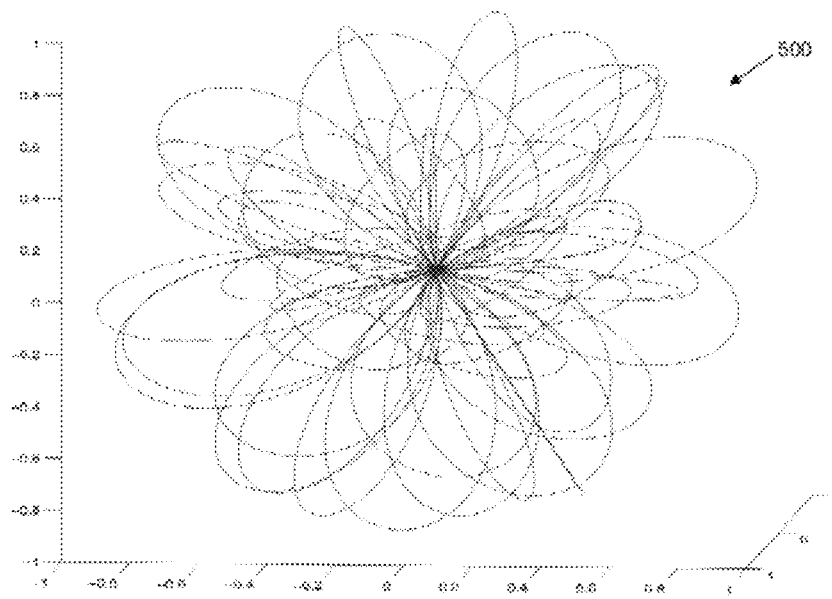
FIG. 5 shows a gradient trajectory for extension of the 2D trajectory in FIGS. 1 to 3.

FIG. 5 shows a gradient trajectory 500 for extension of the 2D trajectory in the abstract to 3D. While this is not the only possible efficient trajectory, the trajectory 500 displays good properties for this application: 1) low curvature; 2) pseudo-random coverage of the 3D trajectory space; and 3) frequent travel to the center of the trajectory, but from different directions.

The described techniques, systems and apparatus can achieve more time efficient, lower in SAR, and makes much more efficient use of gradients. For example, the techniques, systems and apparatus described in this application can generate random transverse (observable) magnetization using very short random RF pulses (~10 microseconds each), applied approximately once every millisecond, with continuous gradients and data acquisition between RF pulses, for a time efficiency of 99% (99% of the time is spent acquiring data).

Useful Tangible Applications

The disclosed techniques is a general approach to data acquisition for MRI, and can potentially replace most existing MRI imaging strategies. The described techniques, apparatus and systems can provide high information efficiency on the data acquisition side that can provide higher efficiency scanning 1) One natural implementation of this method is in 3D mode, and in this mode, at clinically useful resolutions, the computational power required for image reconstruction can be prohibitive using current reconstruction algorithms. Practical application may need faster computers and/or faster reconstruction algorithms tailored to this type of acquisition. 2) This methodology can be implemented on current MRI scanners. The requisite components are present, but this method may imply certain requirements for gradient accuracy and RF switching, which may be possible to achieve on currently deployed MRI scanners. Also, future generations of MRI scanners can be specifically designed to implement the described techniques.

Efficient Randomly Encoded Data Acquisition for Compressed Sensing

In another aspect, techniques, system and apparatus are described for maximizing information efficiency. Because MR images are compressible, the information content is smaller than the number of pixels. Compressed Sensing (CS) allows for reconstruction of images using an amount of data that is closer to the actual information content, and calls for sampling functions that are incoherent (dense) in the sparse domain. SNR efficiency can be maximized with high steady state transverse magnetization and high A/D duty cycle, as exemplified by balanced SSFP. In clinical MRI, images of the same anatomy with different image contrast are often acquired, and the mutual information between these images is high. The described techniques implement an imaging strategy that combines all of above considerations.

Described image strategy can implement ultra short TR with small flip angle random phase RF pulses, semi-randomly distributed in excitation K-space, generating spatially random excitation and high pseudo-steady state transverse magnetization. Random basis functions have dense representations in almost any sparse transform domain.

Also, the described imaging strategy can use low curvature gradient trajectory that rapidly traverses K-space, and can allow for continuously interleaved excitation and acquisition, with very high A/D duty cycle. Simultaneous estimation of proton density, relaxation times, and resonance offset can be obtained using CS methods.

Figure 6:
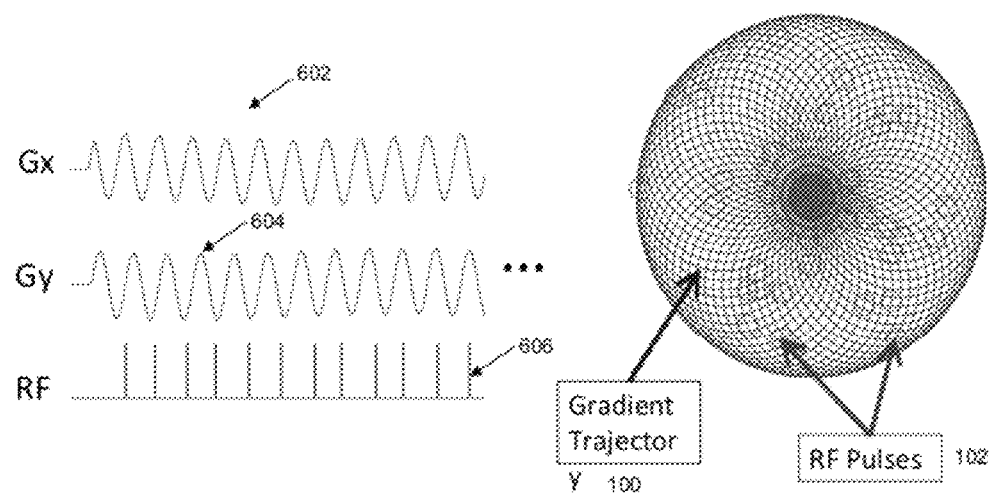
FIG. 6 shows an exemplary pulse sequence.

FIG. 6 shows an exemplary pulse sequence. The pulse sequence can include the previously disclosed Rosette trajectory (2D or 3D), 10 ms 2° RF pulses every ~1 ms, A/D on all other times (99% theoretical A/D duty cycle), and RF pulses random phase and jittered in time (pseudo-random in K). At pseudo-steady state, basis function become noise like and therefore, data becomes noise-like.

Figure 7:
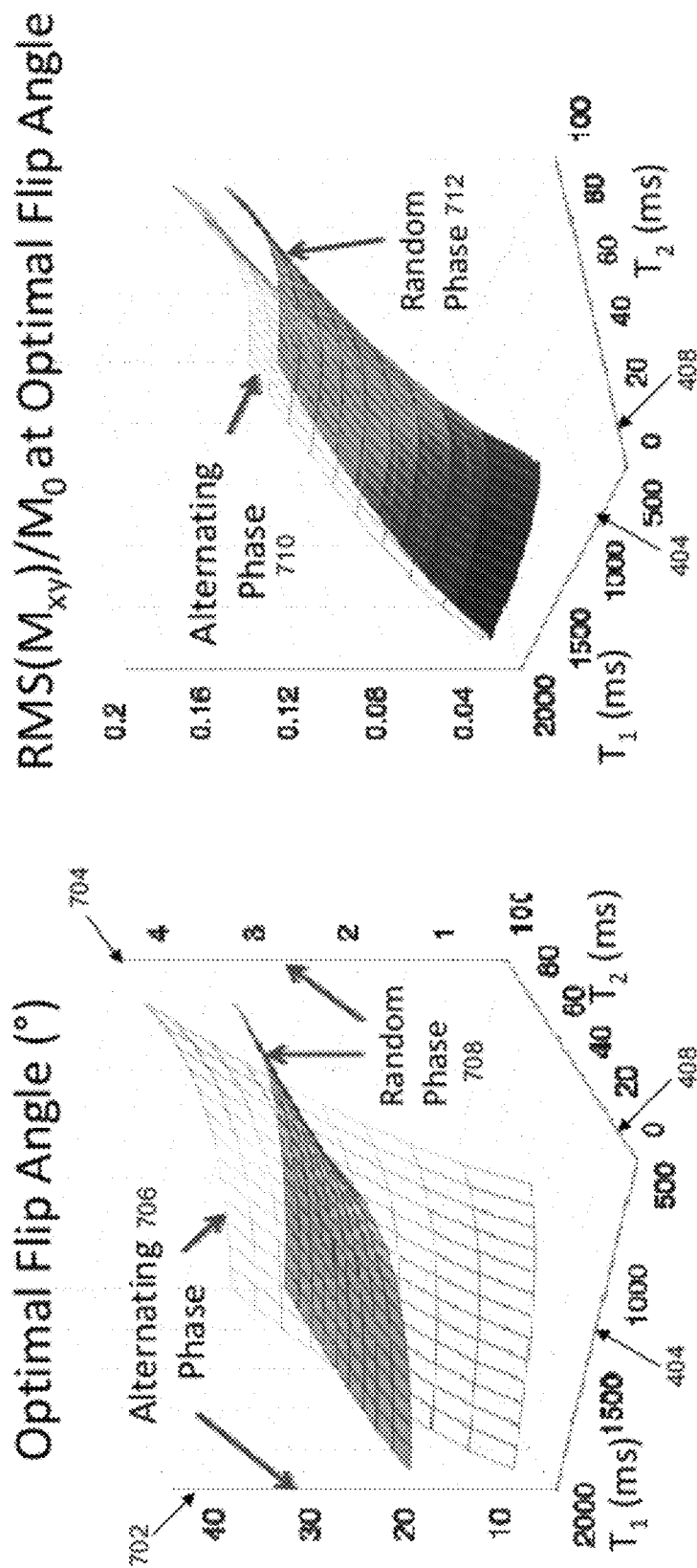
FIG. 7 shows an exemplary random excitation.

FIG. 7 shows an exemplary random excitation. Simulation can be based on TR=1 ms with on resonance. At steady state, alternating phase 706, plotted with reference to axis 702, (i.e., balanced SSFP) produces alternating Mxy 710. Random phase 708, plotted with reference to axis 704, produces similar RMS(Mxy) 712, but randomly fluctuating. Optimal flip angle for random phase is 10 times lower. Because the RF phase angles are random, the RMS signal magnitude for any given isochromat is independent of resonance offset.

Figure 8:
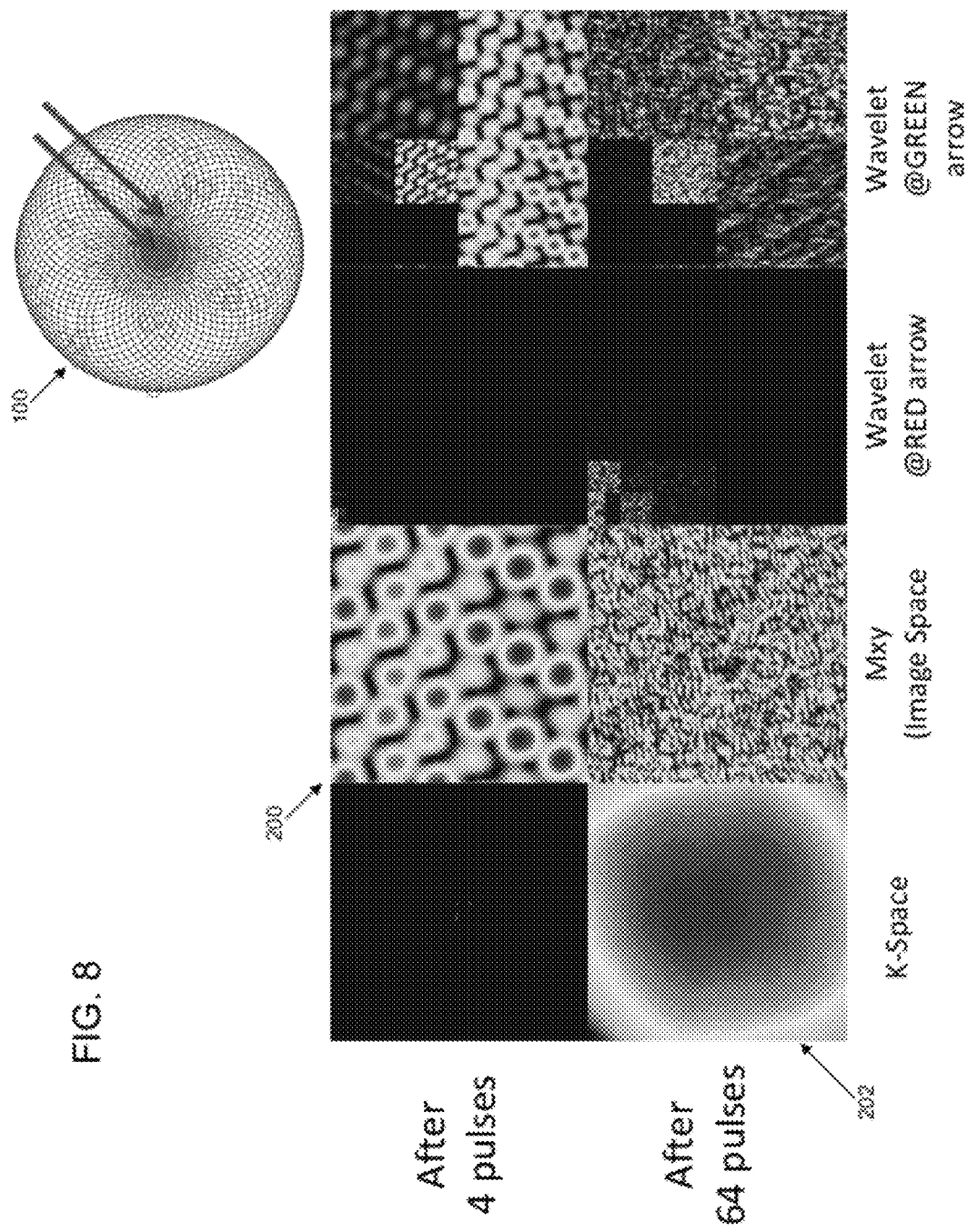
FIG. 8 is a block diagram representation of a scheme to produce spatially random excitation.

FIG. 8 shows a proposed scheme to produce spatially random excitation. Basis functions have relatively dense representations in the Wavelet domain.

Figure 9:
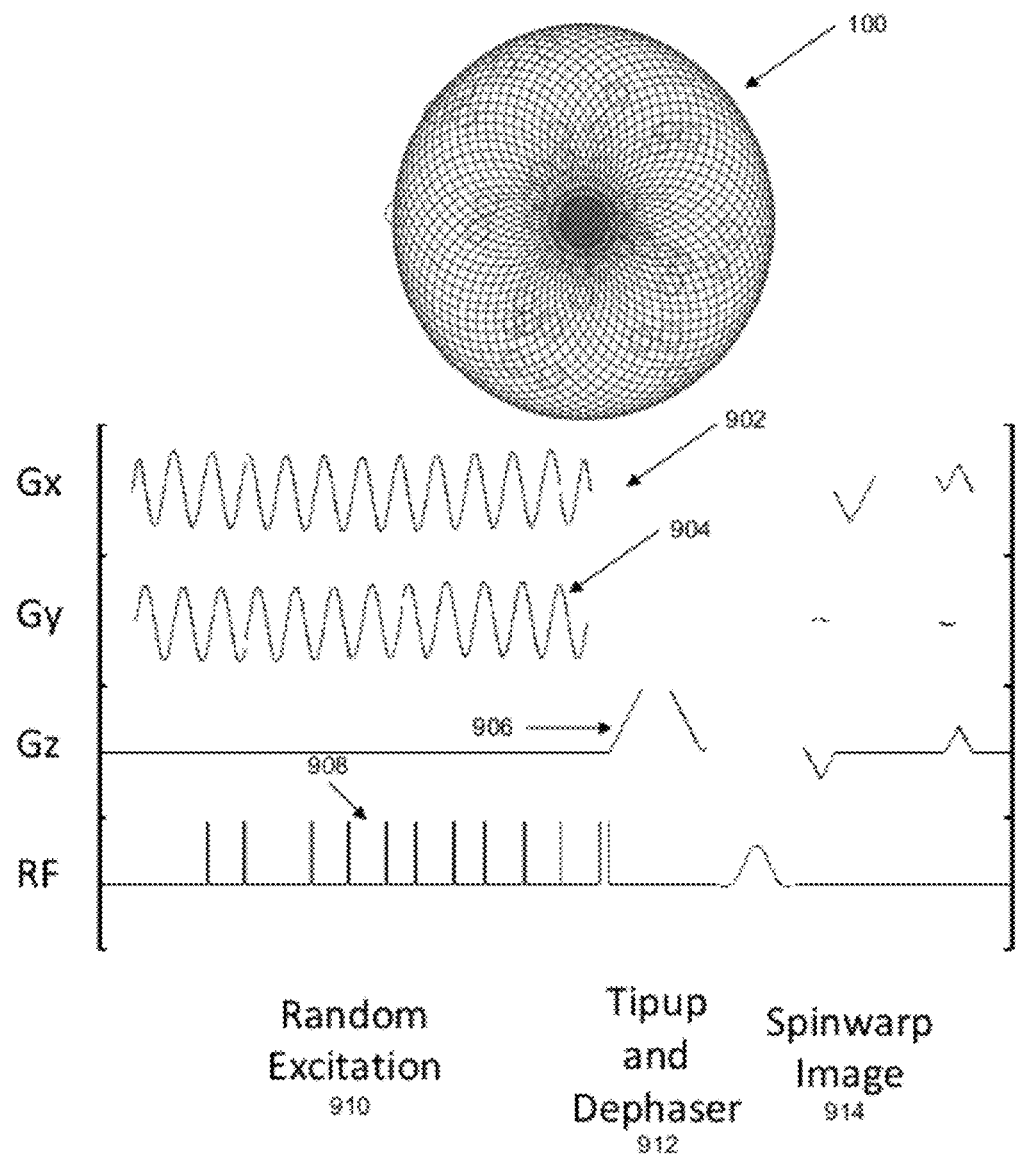
FIG. 9 shows an exemplary 2D random excitation.

FIG. 9 shows an exemplary 2D random excitation. The plot 902 shows gradient along the x direction. The plot 904 shows gradient along the Y direction and the plot 906 shows gradient along the Z direction. Rapid RF switching, e.g, as shown in plot 908 may be used. In one implementation, for proof of concept, a snapshot of Mxy generated by excitation scheme was imaged: Random excitation Tip Mx into Mz; Destroy Mxy using dephasing gradient; Retip Mz into Mx using slice selective pulse; Image Mx using conventional spinwarp sequence; and Repeat for My.

Figure 10:
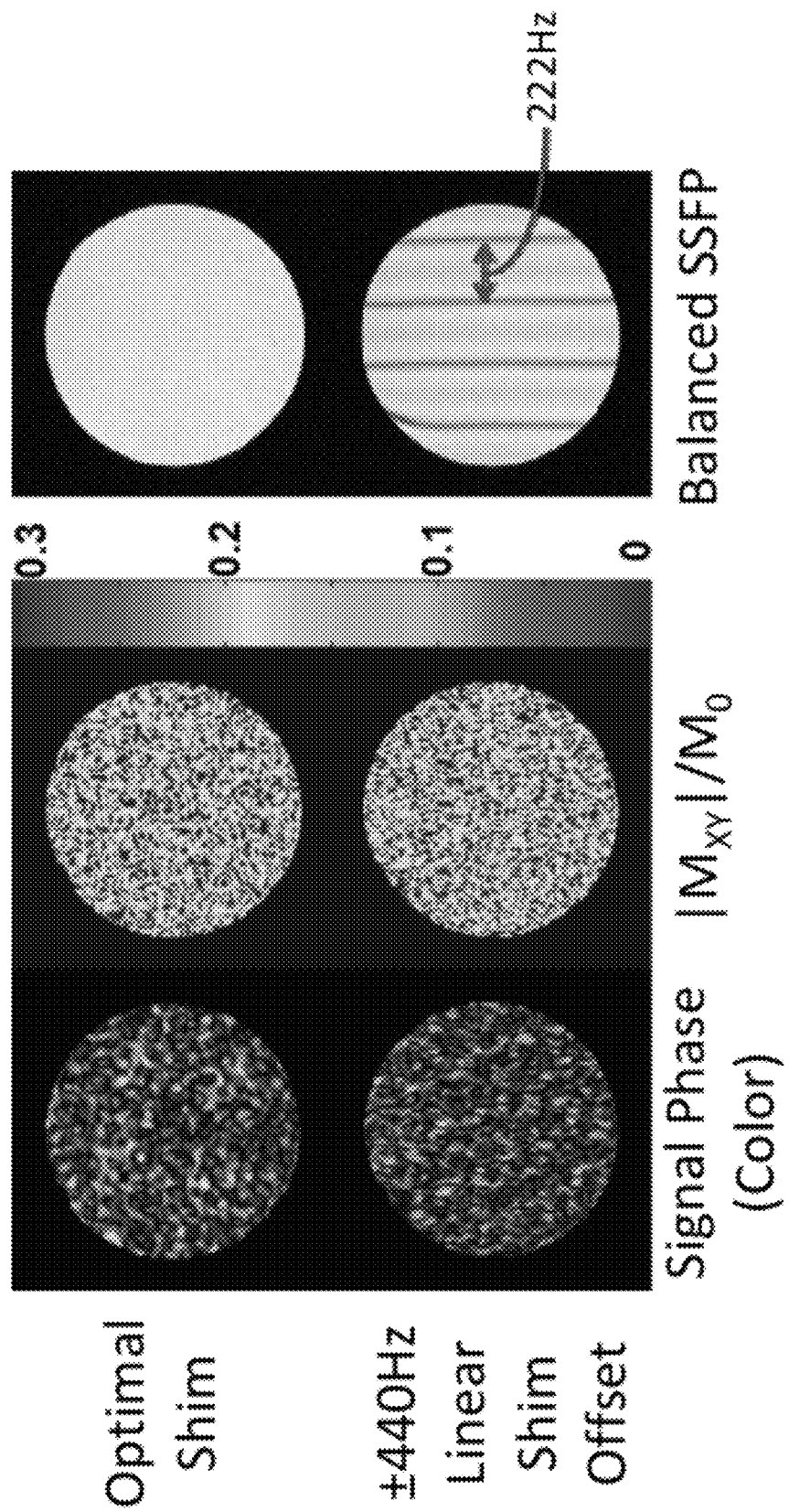
FIG. 10 shows resonance insensitivity measurements.

FIG. 10 shows the resonance insensitivity of the disclosed techniques. A Silicon Oil Phantom is used with T1=220 ms and T2=28 ms. RMS(MXY/M0) equals 0.15 on resonance, 0.17 with shim offset, and 0.15 by simulation. No change in signal magnitude was shown with resonance offset. Signal magnitude and phase remain spatially pseudo-random. By contrast, balanced SSFP with TR equals 4.5 ms shows typical banding with shim offset.

Figure 11:
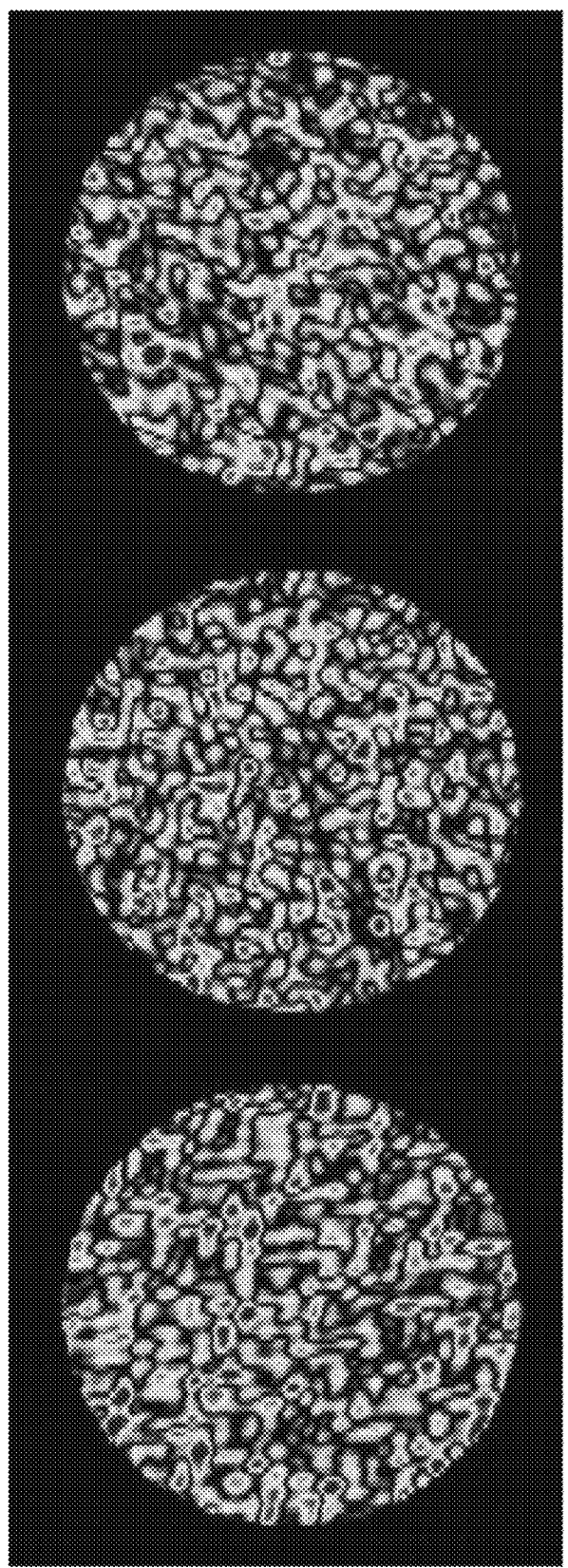
FIG. 11 shows image results obtained in a pseudo-steady state.

FIG. 11 shows pseudo-steady state. Silicon Oil Phantom with T1=220 ms and T2=28 ms are used. $M_{XY}$ is imaged after different numbers of pulses 128, 256 and 512 (represented by images 1100, 1102 and 1104 respectively). No change in signal magnitude after pseudo-steady state is reached. $M_{XY}$ remains spatially pseudo-random with similar spatial scale.

Figure 12:
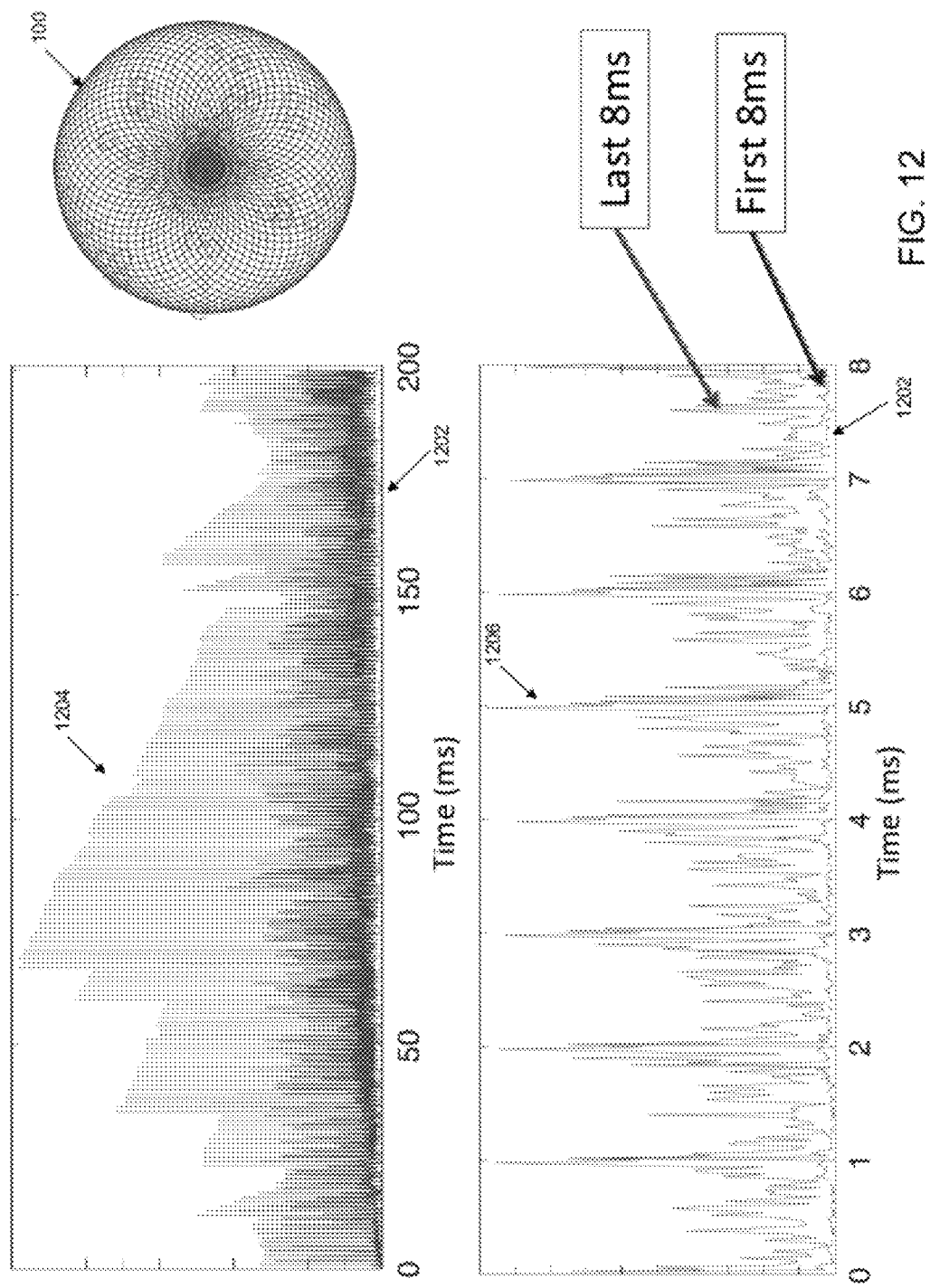
FIGS. 12 and 13 show simulated data.
Figure 13:
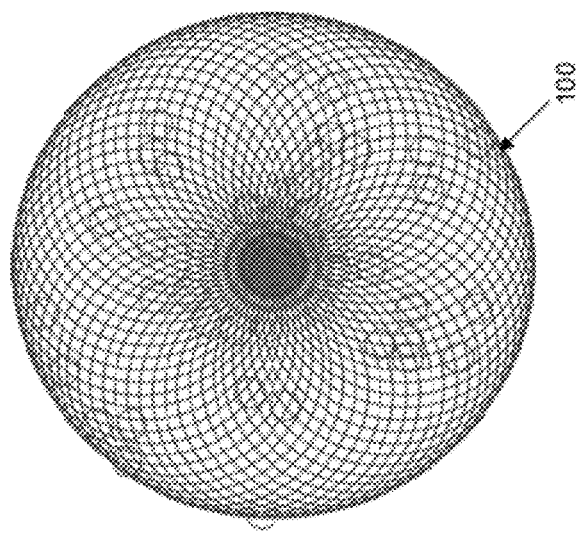
Figure 13:
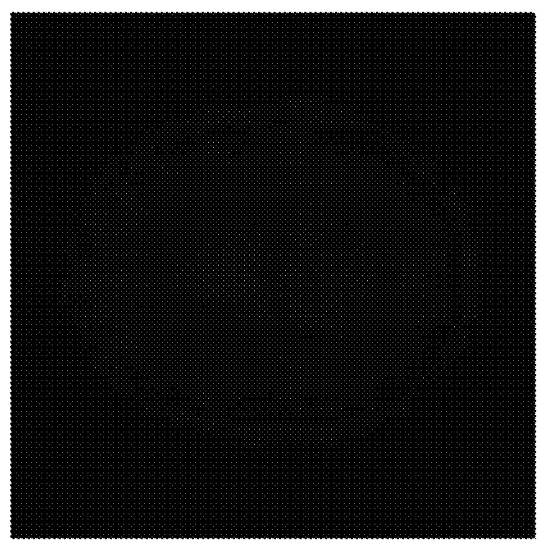
Figure 13:
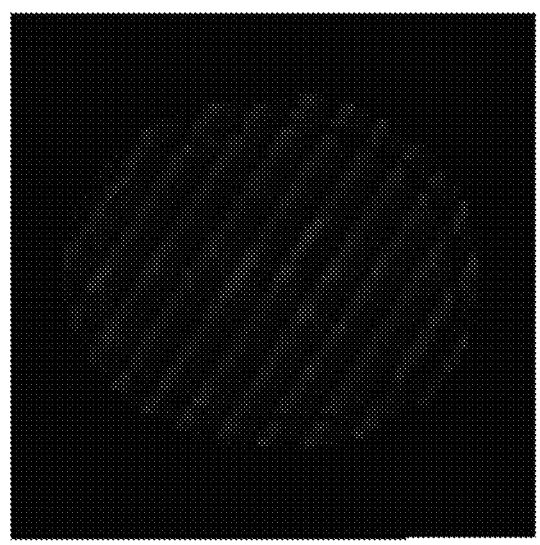

FIGS. 12 and 13 show simulated data gradient and RF pulses (1204, 1206) as a function of time (axis 1202). In FIG. 13, simulated $M_{XY}$ 1302 is shown as a function of time through the gradient and RF trajectory is shown on the right. $|M_{XY}|$ is shown as brightness. Phase($M_{XY}$) is shown as hue. Both magnitude and phase of $M_{XY}$ are spatially and temporally random.

Compressed sensing reconstruction: Image reconstruction using compressed sensing is typically formulated as a problem of finding m that minimizes the cost function C:

$$C(m)=\|F(m)-y\|_2^2+\lambda\|\Psi(m)\|_1 \quad \text{Equation (2)}$$

where F(m)=sample transform,
y=data,
ψ(m)=sparsifying transform

When F is linear, the minimization is relatively straightforward, but this linearity is not central to the principles of compressed sensing. In one implementation, the following cost function was used:

$$C(pd, T_2, f)=\|F(pd, T_2, f)-y\|_2^2+\lambda_1\|W(pd)\|_1+\lambda_2 TV(pd) \quad \text{Equation (3)}$$

F was a non-linear direct integration of the Bloch equation, including spatially inhomogeneous T2 and resonance offsets f. W was a 2D wavelet transform, and TV the total variation. C was minimized using conjugate gradient descent, and the gradient of C was calculated numerically.

Figure 14:
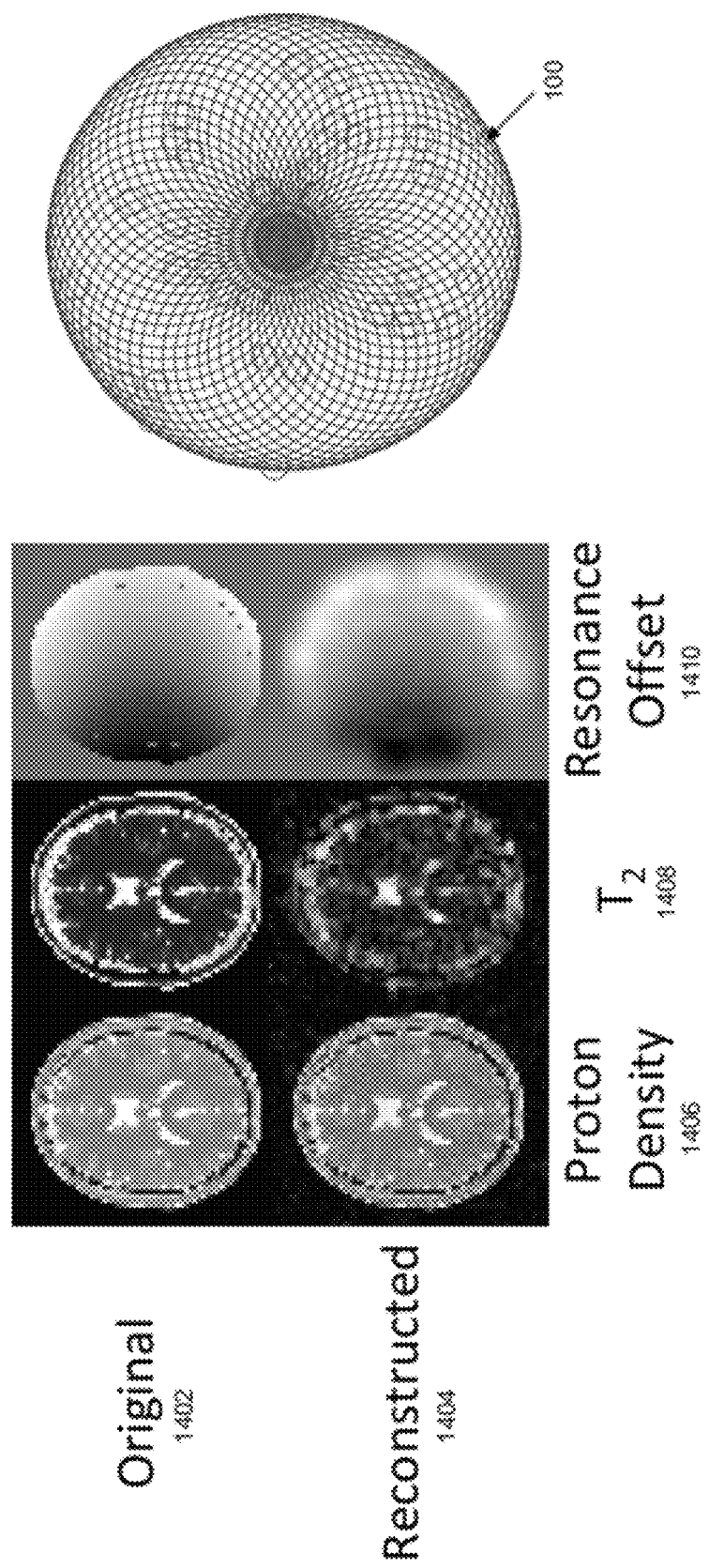
FIG. 14 shows images reconstructed from simulated data.

FIG. 14 shows images reconstructed from simulated data. The original image is shown in row 1402, showing proton density 1406, T2 1408 and resonance offset 1410. Initial estimates was based on PD=0, T2=50 ms, and Resonance Offset=0. Peak resonance offset=3 Hz, which indicates severe sensitivity to local minima with large resonance offsets. Conjugate gradient descent with numerical calculation of gradients. The estimate was made based on 200 iterations.

The approach described in this document can simultaneously produce high steady state signal, high A/D duty cycle, pseudo-random sampling functions, and resonance offset independent signal magnitude. It is therefore both SNR efficient and amenable to CS reconstruction.

Because the mutual information between PD, T1, and T2 images is high, simultaneous estimation of these images should be more efficient than separate acquisition of the same anatomy with different contrasts, and it is natural to add mutual information to the cost function.

The distribution of coherences is controlled by the distribution of RF pulses in K-space and by the flip angle, which determines the weighting of echo pathways. There is a tradeoff in which the randomness of the sampling function improves with a broader coherence distribution, but eventually leads to signal loss from intravoxel dephasing.

There exists a method to generate signals with highly time efficient information content as described above. The primitive nonlinear approach to reconstruction used here was for initial demonstration only.

Figure 15:
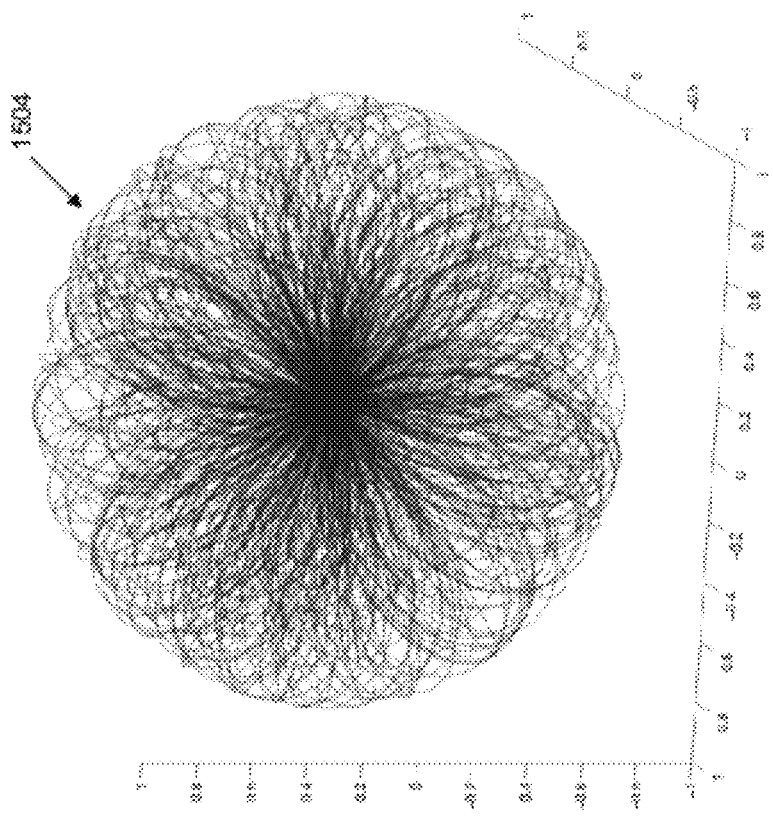
FIG. 15 shows an extension to 3D.
Figure 15:
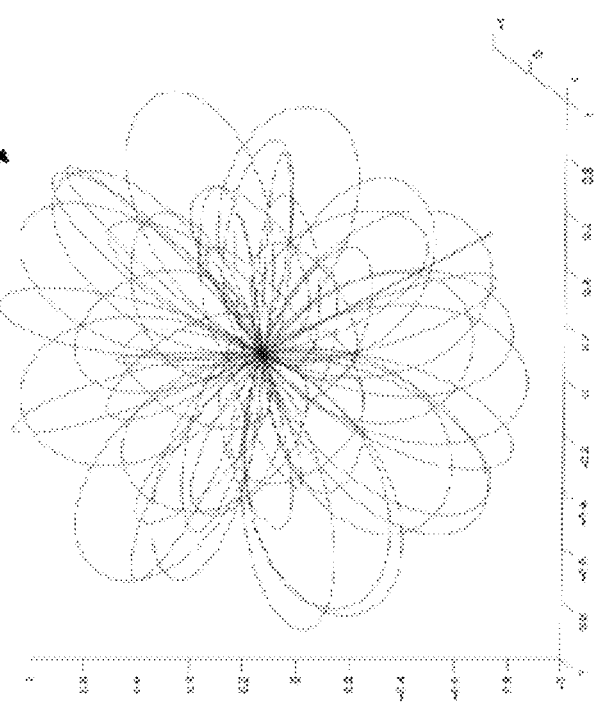

FIG. 15 shows an extension to 3D, showing two trajectories 1502, 1504. FIG. 15 shows 3D rosette-like trajectory. With a low curvature trajectory and current gradient hardware, 2563 points over an FOV of 20 cm can be collected in approximately 1 minute.

Figure 16:
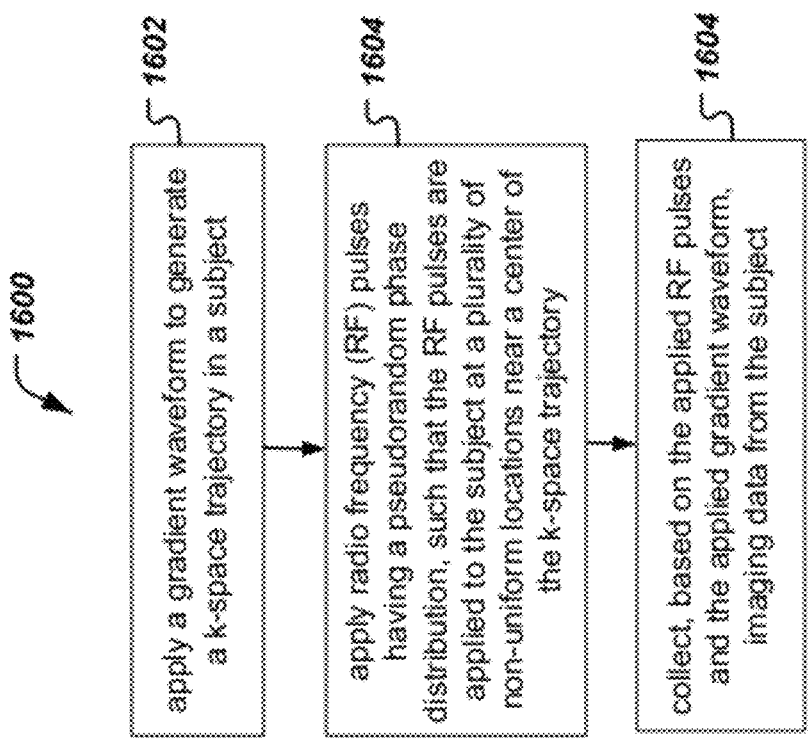
FIG. 16 is a flow chart representation of a magnetic resonance imaging process.

FIG. 16 is a flow chart representation of a process 1600 of magnetic resonance imaging. At 1602, a gradient waveform is applied to generate a k-space trajectory in a subject. At 1604, radio frequency (RF) pulses having a pseudorandom phase distribution are applied, such that the RF pulses are applied to the subject at a plurality of non-uniform locations near a center of the k-space trajectory. At 1606, based on the applied RF pulses and the applied gradient waveform, imaging data is collected from the subject. As previously discussed, in some implementations, the k-space trajectory includes a smooth k-space trajectory. In some implementations, the gradient waveform comprises gradient pulses and the gradient pulses and the RF pulses comprise pulses that have a pseudorandom distribution of RF energy towards a center of the k-space. In some implementations, the imaging data is collected as projections of the subject's magnetization on pseudorandom sampling functions. It should be noted that the terms "random" and pseudorandom, in one aspect, have the same meaning because most man-made technologies and apparatus follow "an algorithm" and therefore are not truly random.

In some implementations, responsive to the applied RF pulses, a distribution of coherences is generated, which produces a spatially random excitation with feature sizes that are controllable by the random phase distribution and non-uniform locations of the applied RF pulses. In some implementations, the non-uniform locations at which RF pulses are applied are selected such that at any particular voxel, or a unit volume point, the excitation is modulated in time.

Figure 17:
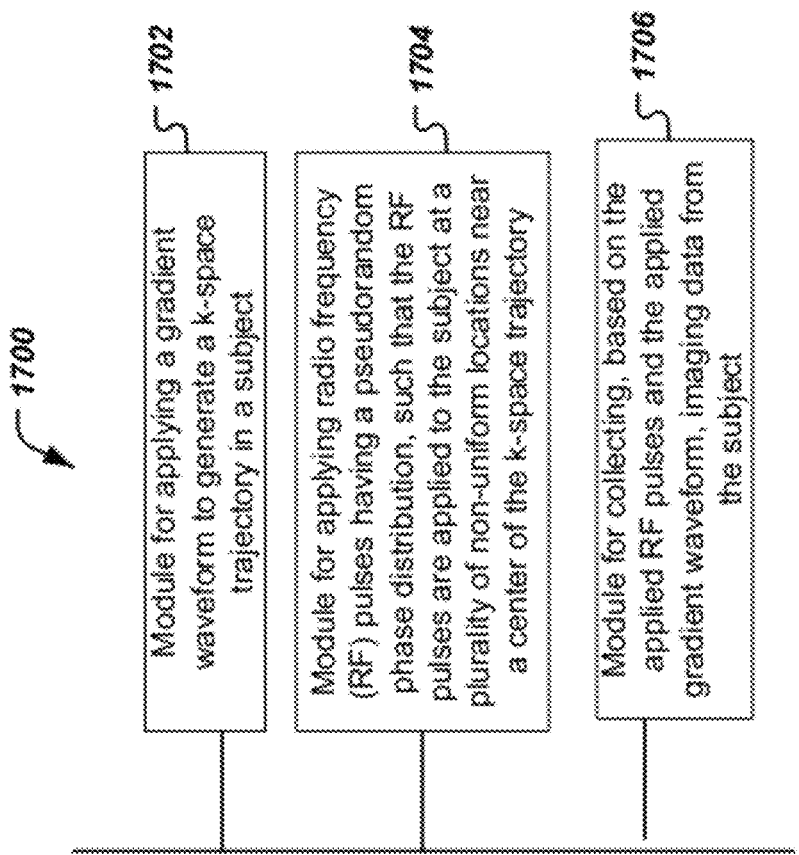
FIG. 17 is a block diagram representation of a magnetic resonance imaging apparatus.

FIG. 17 is a block diagram representation of an apparatus 1700 for magnetic resonance imaging. The module 1702 is for applying a gradient waveform to generate a k-space trajectory in a subject. In some implementations, the module 1702 is implemented, e.g., one or more coils. The module 1704 is for applying radio frequency (RF) pulses having a pseudorandom phase distribution, such that the RF pulses are applied to the subject at a plurality of non-uniform locations near a center of the k-space trajectory. In some implementations, the module 1704 is, e.g., implemented as one or more coils. The module 1706 is for collecting, based on the applied RF pulses and the applied gradient waveform, imaging data from the subject. In some implementations, the module 1706 may be implemented as one or more collector coils. The modules 1702, 1704 and 1706 may be further configured to implement one or more techniques disclosed in this document.

It will be appreciated that this patent document disclosed techniques, systems and apparatus for magnetic resonance imaging in which randomized RF pulses are used to achieve superior MRI performance. In some implementations, the RF pulses may be randomized in the sense that the phases of the RF pulses may exhibit pseudorandom distribution around the unit circle. In some implementations, the RF pulses may be randomized in terms of the positions where the RF pulses are applied to a subject. In one aspect, the gradient waveform used with the randomized RF pulses may be designed to generate a k-space trajectory that is smooth and the position locations of the RF pulses may be near the center of the k-space trajectory.

It will further be appreciated that the disclosed RF pulses and gradient waveforms generate data samples that advantageously map to projections on random sampling function, which lends the data to image construction using a compressed sensing optimization technique.

It will further be appreciated that the disclosed techniques enable operation of MRI equipment with one-hundredth the RF power of other non-uniform phase techniques such as the SSTP. In one aspect, the low power operation exposes the subject to less RF power. In other advantageous aspect of the disclosed methods over the SSTP, because there is not dependency on local uniformity of magnetic fields, the presently disclosed techniques do not suffer from the black stripes that are sometimes observed in SSTP based MRIs.

Implementations of the subject matter and the functional operations described in this specification (e.g., the collector, the coherence distribution generator, the location selector, the estimator, etc.) can be implemented in digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non volatile memory, media and memory devices, including by way of example semiconductor memory devices, e.g., EPROM, EEPROM, and flash memory devices. The processor and the memory can be supplemented by, or incorporated in, special purpose logic circuitry.

While this specification contains many specifics, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Only a few implementations and examples are described and other implementations, enhancements and variations can be made based on what is described and illustrated in this application.

What is claimed is:

1. A method of magnetic resonance imaging (MRI), the method comprising:
    applying, by a coil, a gradient waveform in order to generate a k-space trajectory in a subject;
    applying, by a pulse generator, radio frequency (RF) pulses having a pseudorandom phase distribution, such that the RF pulses are applied to the subject at a plurality of non-uniform locations near a center of the k-space trajectory, wherein the RF pulses are applied using a flip angle that is 2 degrees or less in order to determine a weighting of echo pathways; and collecting, imaging data from the subject that is sampled by a processor, based on the applied RF pulses and the applied gradient waveform, imaging data from the subject;

wherein none of the sampled imaging data that is collected by the processor occurs at the center or origin of K-space even when a K-space trajectory passes through the center or origin of K-space; and generating an MRI image that is stored in a memory.

2. The method of claim 1, wherein the k-space trajectory is a smooth k-space trajectory.

3. The method of claim 1, wherein the gradient waveform comprises gradient pulses; wherein the gradient pulses and the RF pulses comprise pulses that have a pseudorandom distribution of RF energy towards a center of the k-space.

4. The method of claim 1, wherein the applied RF pulses cause the subject to become magnetized by producing rotating magnetic fields in the subject, and wherein the operation of collecting the imaging data from the subject, comprises collecting projections of the subject's magnetization on pseudorandom sampling functions.

5. The method of claim 1, further comprising:
generating, by the processor, responsive to the applied RF pulses, a distribution of resonance coherences, which produce a spatially random excitation with feature sizes that are controllable by the random phase distribution at the non-uniform locations of the applied RF pulses.

6. The method of claim 5, wherein the applying the RF pulses at the non-uniform locations comprises:
selecting, with a location selector, the non-uniform locations such that excitation at any particular voxel is modulated in time.

7. The method of claim 4, further comprising:
performing, with an estimator, a simultaneous estimation of proton density, relaxation times, and resonance offset using a compressed sensing technique on the collected projections.

8. The method of claim 1, wherein the RF pulses are applied using a repetition time constant TR equal to or less than 1 millisecond.

9. The method of claim 8, wherein the applied RF pulses include very short random pulses of substantially 10 microseconds.

10. An apparatus configured for magnetic resonance imaging (MRI), comprising:
a first coil that applies a gradient waveform in order to generate a k-space trajectory in a subject;
a radio frequency (RF) pulse generator that generates RF pulses having a pseudorandom phase distribution;
a second coil that applies the RF pulses such that the RF pulses are applied to the subject at a plurality of non-uniform locations near a center of the k-space trajectory and using a flip angle that is 2 degrees or less in order to determine a weighting of echo pathways; and
a collector that collects, imaging data from the subject that is sampled based on the applied RF pulses and the applied gradient waveform, imaging data from the subject;
wherein none of the sampled imaging data that is collected by the processor occurs at the center or origin of K-space even when a K-space trajectory passes through the center or origin of K-space; and generating an MRI image that is stored in a memory.

11. The apparatus of claim 10, wherein the k-space trajectory is a smooth k-space trajectory.

12. The apparatus of claim 10, wherein the gradient waveform comprises gradient pulses; wherein the gradient pulses and the RF pulses comprise pulses that have a pseudorandom distribution of RF energy towards a center of the k-space.

13. The apparatus of claim 10, wherein the collector further collects imaging data from the subject, by collecting projections along pseudorandom sampling functions.

14. The apparatus of claim 10, further comprising:
a coherence distribution generator that generates, responsive to the applied RF pulses, a distribution of coherences, whereby the distribution of coherences produces a spatially random excitation with feature sizes that are controllable by the random phase distribution and the non-uniform locations of the applied RF pulses.

15. The apparatus of claim 14, further comprising:
a location selector that selects the non-uniform locations where the RF pulses are applied such that an excitation at any particular voxel is modulated in time.

16. The apparatus of claim 13, further comprising:
an estimator that performs simultaneous estimation of proton density, relaxation times, and resonance offset by using a compressed sensing technique on the collected projections.

17. The apparatus of claim 10, wherein the second coil applies the RF pulses using a repetition time constant TR equal to or less than 1 millisecond.

18. The apparatus of claim 7, wherein the applied RF pulses include very short random pulses of substantially 10 microseconds.

19. A magnetic resonance imaging (MRI) system, comprising:
a data acquisition subsystem that acquires randomly encoded MRI data from a subject; and
a compressed sensing subsystem that performs compressed sensing reconstruction on the randomly encoded MRI data in order to reconstruct an image of the subject,
wherein the data acquisition subsystem includes a magnetization subsystem that is operable in order to apply, to the subject, gradient pulses in order to generate a k-space trajectory and radio frequency (RF) pulses at non-uniform locations near a center of the k-space trajectory, the RF pulses having pseudorandom phases such that the randomly encoded MRI data is amenable to a reconstruction by the compressed sensing subsystem,
wherein the magnetization subsystem is also operable in order to apply the RF pulses using a flip angle that is 2 degrees or less in order to determine a weighting of echo pathways; and
a collector that collects, the randomly encoded MRI data from the subject;
wherein none of the randomly encoded MRI data that is collected by the collector occurs at the center or origin of K-space even when a K-space trajectory passes through the center or origin of K-space; and
generating an MRI image that is stored in a memory.

20. The system of claim 19, wherein the magnetization subsystem is operable to apply very short random RF pulses of substantially 10 microseconds.

* * * * *